United States Patent [19]

Sonetaka

[11] Patent Number: 4,875,021

[45] Date of Patent: Oct. 17, 1989

[54] PSEUDO-NOISE SEQUENCE GENERATOR

[75] Inventor: Noriyoshi Sonetaka, Tokyo, Japan

[73] Assignee: NEC Corporation, Tokyo, Japan

[21] Appl. No.: 214,077

[22] Filed: Jul. 1, 1988

[30] Foreign Application Priority Data

Jul. 1, 1987 [JP] Japan .................. 62-164271

[51] Int. Cl.[4] ............................................ H03B 29/00
[52] U.S. Cl. ....................................... 331/78; 364/717
[58] Field of Search ........................... 331/78; 364/717;
328/61; 307/260

[56] References Cited

U.S. PATENT DOCUMENTS 4,161,041 7/1979 Butler et al. .................. 364/717 X Primary Examiner—Eugene R. LaRoche
Assistant Examiner—Robert J. Pascal
Attorney, Agent, or Firm—Sughrue, Mion, Zinn, Macpeak & Seas

[57] ABSTRACT

A pseudo-noise sequence generator includes a memory which is accessed by a (2n+m)-bit address signal and outputs a parallel n-bit pseudo noise sequence prestored at a corresponding address, and n registers for delaying each bit of the parallel n-bit output signal from the memory by one clock. The (2n+m)-bit address signal consists of a parallel n-bit digital input signal, the outputs from the n registers, and an m-bit control signal.

2 Claims, 5 Drawing Sheets

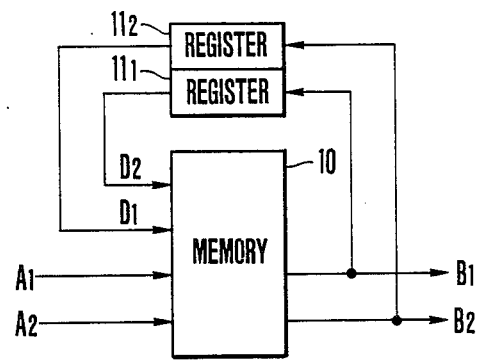
FIG.5
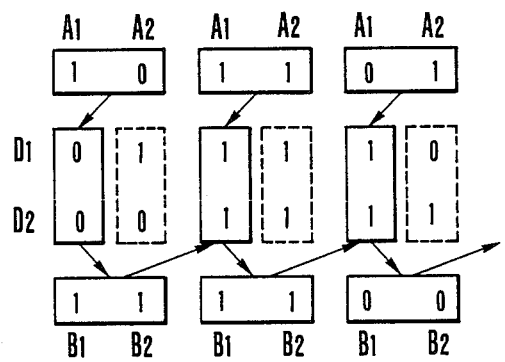
FIG.6
| A1 | A2 | D1 | D2 | D1 | D2 | D1 | D2 | D1 | D2 |
|----|----|----|----|----|----|----|----|----|----|
|    |    | 0  | 0  | 1  | 0  | 0  | 1  | 1  | 1  |
| 0  | 0  | 0  | 0  | 1  | 0  | 1  | 1  | 0  | 1  |
| 1  | 0  | 1  | 1  | 0  | 1  | 0  | 0  | 1  | 0  |
| 0  | 1  | 0  | 1  | 1  | 1  | 1  | 0  | 0  | 0  |
| 1  | 1  | 1  | 0  | 0  | 0  | 0  | 1  | 1  | 1  |
FIG.7

PSEUDO-NOISE SEQUENCE GENERATOR

BACKGROUND OF THE INVENTION

The present invention relates to a pseudo-noise sequence (to be referred to as a PN sequence hereinafter) generator.

A PN sequence means a code having a binary cyclic sequence in which the auto-correlation function takes only two values, and is disclosed in detail in SOLOMON W. GOLOMB, et al., "Digital Communications", PRENTICE-HALL, INC, pp. 17–32.

In order to obtain a PN sequence from parallel digital input signals, the following two conventional methods shown in FIGS. 1 and 2 are employed. In FIG. 1, parallel input signals $A_1$ to $A_n$ are converted to a serial signal by a parallel-to-serial (P/S) converter 1, and is coded to a PN sequence by a conventional PN sequence generator 2. The obtained PN sequence is converted to parallel signals $B_1$ to $B_n$ by a serial-to-parallel (S/P) converter 3. In FIG. 2, parallel input signals $A_1$ to $A_n$ are respectively coded to a PN sequence by PN sequence generators 2, thus obtaining parallel PN sequence outputs $B_1$ to $B_n$. FIG. 3 shows the arrangement of the PN sequence generator 2 shown in FIGS. 1 and 2. In FIG. 3, an nth bit corresponding to the final stage of a shift register 22 having N stages (N: an arbitrary natural number) and an arbitrary bit are input to an exclusive-OR gate (to be referred to as an EXOR hereinafter) 23. The output from the EXOR 23 and an input signal a are input to an EXOR 21. The output from the EXOR 21 is output as a PN sequence b, and is also input to the first stage of the shift register 22.

In the conventional circuit shown in FIG. 1, if the number of parallel digital input signals is increased, only one PN sequence generator 2 is required, resulting in hardware and cost advantages. However, along with an increase/decrease in number of parallel digital input signals, the arrangements of the P/S converter 1 and the S/P converter 3 must be changed, and clock signals necessary for these converters must be prepared.

In contrast to this, in the conventional circuit shown in FIG. 2, no P/S and S/P converters nor timing signals therefor are required. However, the PN sequence generators 2 corresponding in number to parallel digital input signals must be prepared, resulting in hardware and cost disadvantages.

In both the circuits, since the shift register 22 is used, a processing time corresponding to a code length n is necessary, and an operating speed is low accordingly.

In the conventional circuit shown in FIG. 1, when all the stages $D_i$ (i=1 to n) of the shift register 22 are 0, if all the inputs $A_i$ (i=1 to n) are also 0, the outputs $B_i$ (i=1 to n) continuously generate an identical pattern of 0. If all the stages $D_i$ are 1 and all the inputs $A_i$ are 1, the outputs $B_i$ also continuously generate 1. This does not satisfy a condition that identical patterns corresponding to a period of the code length n necessary for a pseudo-noise signal of, e.g., a scrambler must not be generated. When the PN sequence is encrypted and added, the code length n of the PN sequence can be undesirably easily detected due to generation of identical patterns.

When the number n of signal lines to be subjected to parallel processing is to be arbitrarily changed, or when the code length n necessary when the PN sequence is used as a code is to be arbitrarily changed, the above conventional circuits cannot quickly cope with this.

SUMMARY OF THE INVENTION

It is an object of the present invention to eliminate the conventional drawbacks and to provide a PN sequence generator which can facilitate coding of PN sequences of parallel digital signals and is advantageous in terms of hardware and cost.

It is another object of the present invention to provide a PN sequence generator which can easily cope with an increase/decrease in number of parallel digital signals.

It is still another object of the present invention to provide a PN sequence generator which can eliminate a continuous state of identical codes and can perform coding of PN sequences best suitable for a scrambler or the like.

A pseudo signal generator according to an aspect of the present invention comprises a memory accessed by a 2n-bit address signal to output a parallel n-bit pseudo-noise sequence, n out of 2n address signal input terminals of the memory receiving n parallel digital signal bits, and n registers for delaying each bit of n-bit data output from the memory by one clock and outputting the delayed n-bit data, the outputs from the n registers being supplied to remaining n address signal input terminals of the 2n address signal input terminals of the memory in one-to-one correspondence, wherein the memory prestores pseudo-noise sequence data corresponding to an address signal input from the 2n address signal input terminals.

A pseudo signal generator according to another aspect of the present invention comprises a memory accessed by a (2n+m)-bit address signal to output a parallel n-bit pseudo-noise sequence, a parallel n-bit digital signal being input to n of (2n+m) address signal input terminals of the memory, and a parallel m-bit control signal being input to the remaining n address signal input terminals, and n registers for delaying each bit of the n-bit data output from the memory by one clock and outputting the delayed n-bit data, the outputs from the n registers being supplied to the remaining n address signal input terminals of the memory in one-to-one correspondence, wherein the memory prestores pseudo-noise sequence data corresponding to an address signal input from the (2n+m) address signal input terminals.

BRIEF DESCRIPTION OF THE DRAWINGS

FIG. 5 is a block diagram showing a case wherein n=2 in FIG. 4;

FIG. 6 is a state diagram in the circuit shown in FIG. 5;

FIG. 7 is a view showing a content of a memory 10 shown in FIG. 5;

FIG. 10 is a state diagram of the circuit shown in FIG. 9; and

FIG. 11 is a view showing a content of a memory 10 in FIG. 9.

DETAILED DESCRIPTION OF THE PREFERRED EMBODIMENTS

Figure 1:
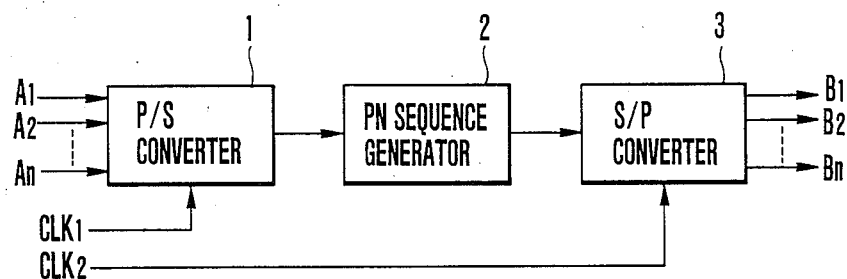
FIGS. 1, 2, and 3 are block diagrams showing prior arts.
Figure 2:
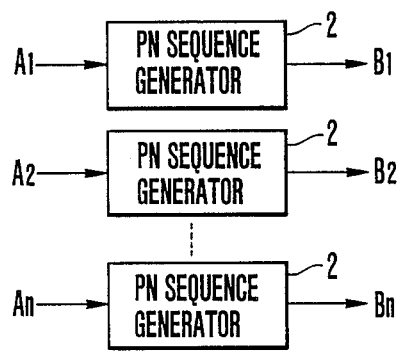
Figure 3:
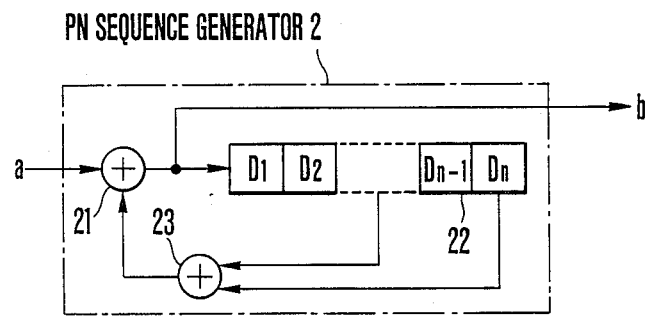
Figure 4:
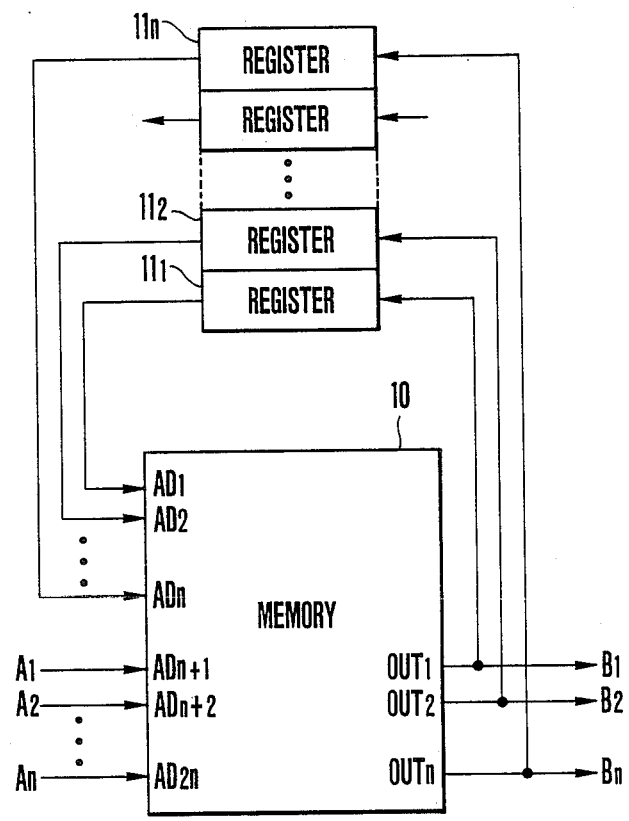
FIG. 4 is a block diagram showing an arrangement of an embodiment of the present invention.

FIG. 4 is a block diagram showing an arrangement of a PN sequence generator according to the present invention.

In FIG. 4, a memory 10 comprises a ROM (read-only memory) or a PROM (programmable ROM), and converts input signals $A_1$ to $A_n$ having a code length of n bits into PN sequence outputs $B_1$ to $B_n$. The memory 10 has 2n address input terminals $AD_1$ to $AD_{2n}$ and n output terminals $OUT_1$ to $OUT_n$. The memory 10 is accessed by a 2n-bit address signal, and outputs a pseudo noise sequence prestored in correspondence with the address signal.

The output terminals $OUT_1$ to $OUT_n$ are respectively connected to the input terminals of the registers $11_1$ to $11_n$ each having a delay function corresponding to one clock. The output terminals of the registers $11_1$ to $11_n$ are respectively connected to the address input terminals $AD_1$ to $AD_n$ of the memory 10. The remaining address input terminals $AD_{n+1}$ to $AD_{2n}$ of the memory 10 receive the input signals $A_1$ to $A_n$, respectively.

FIG. 5 shows a case wherein n=2 in FIG. 4, and FIG. 6 is a state diagram of the circuit shown in FIG. 5.

In FIG. 5, the memory 10 has 4 address input bits and 2 output bits $B_1$ and $B_2$. The 2 output bits $B_1$ and $B_2$ are respectively input to registers $11_1$ and $11_2$ each having a delay function corresponding to 1 clock. The output bits respectively delayed by one clock by the registers $11_1$ and $11_2$ serve as the 2 address input bits of the 4 address input bits of the memory 10, and digital input signals $A_1$ and $A_2$ are input to the remaining 2 address input bits of the memory 10. The 2 output bits $B_1$ and $B_2$ are output as PN sequence output bits when code length n=2.

In the state diagram shown in FIG. 6, $D_1$ and $D_2$ respectively indicate the contents of the registers $11_1$ and $11_2$. When input bits $(A_1A_2)=(10)$ and register initial values $(D_1D_2)=(00)$, the PN sequence output bits $(B_1B_2)=(11)$. When $(A_1A_2)=(11)$ and $(D_1D_2)=(11)$, $(B_1B_2)=(11)$.

Therefore, in the circuit shown in FIG. 5, when $(A_1A_2)=(10)$ and one-clock delayed output bits $(D_1D_2)$ from the registers $11_1$ and $11_2=(00)$, the output bits $(VB_1B_2)$ read out from the memory 10 need only be (11). More specifically, when 4 address input bits $8D_1D_2A_1A_2)=(0010)$, (11) need only be prestored as the content of the memory 10. the output bits $(B_1B_2)=(11)$ read out from the memory are supplied to the registers $11_1$ and $11_2$, and are delayed by one clock, respectively. The delayed output bits $(D_1D_2)$ then serve as 4 address input bits together with next input signals $(A_1A_2)$. In this case, if the input bits $(A_1A_2)=(11)$, the 4 address input bits become (1111), and (11) need only be written as the content of the memory 10 in correspondence with these 4 address input bits.

The output bits $(B_1B_2)=(11)$ read out from the memory 10 at that time are written in the registers $11_1$ and $11_2$ again, and are delayed by one clock, respectively, to serve as the 4 address input bits together with the next input signals $(A_1A_2)$. In this case, if the input bits $(A_1A_2)=(01)$, the 4 address input bits become (1101), and (00) need only be written as the content of the memory 10 in correspondence with these 4 address input bits.

Similarly, the contents of the memory 10 corresponding to all the combinations of $(A_1A_2)$ and $(D_1D_2)$ are preset.

FIG. 7 shows 2-bit data stored at addresses of the memory 10 based on combinations of $(A_1A_2)$ and $(D_1D_2)$.

Figure 8:
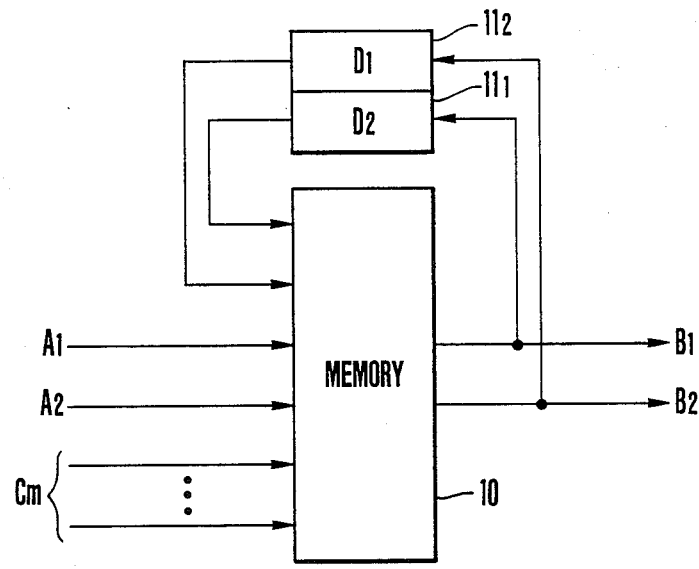
FIG. 8 is a block diagram showing another embodiment of the present invention.

FIG. 8 is a block diagram showing another embodiment of the present invention, and the same reference numerals in FIG. 8 denote the same parts as in FIG. 5. In this embodiment, an m-bit control signal Cm (m: an arbitrary natural number) is used for address input bits of a memory 10 in addition to $(A_1A_2)$ and $(D_1D_2)$.

In the embodiment shown in FIG. 5, like in a conventional circuit, when the initial values of $(D_1D_2)$ are (00) and $(A_1A_2)=(00)$ or (11) are continuously input, a pattern 0 or 1 is continuously output, and the same drawback as in the conventional circuit is caused. In view of this, an m-bit control signal is added as an address input of the memory 10, and a PN sequence corresponding to the (4+m) address input bits is prestored in the memory 10. Thus, even if the input signals $A_1$ and $A_2$ have a continuous pattern of 1 or 0, the memory output bits $B_1$ and $B_2$ will not output the identical patterns.

Figure 9:
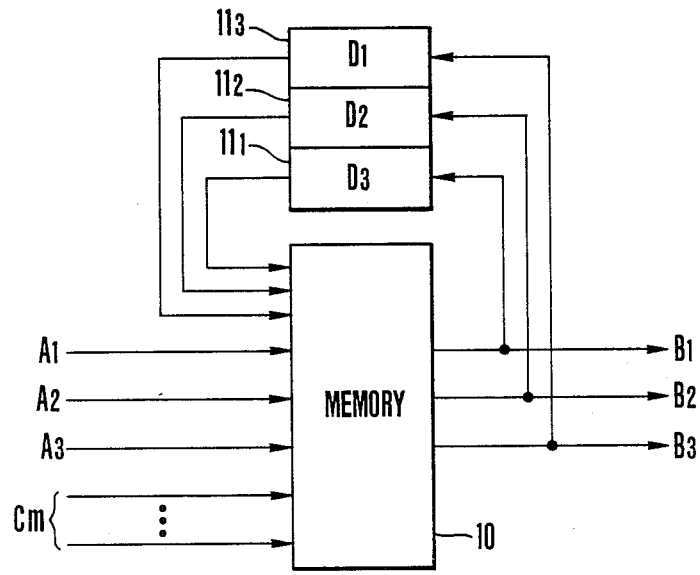
FIG. 9 is a block diagram showing still another embodiment of the present invention.

FIG. 9 is a block diagram showing still another embodiment of the present invention, and shows a case wherein n=3 in the embodiment of FIG. 8. Digital input signals $A_1$, $A_2$, and $A_3$ are converted to a PN sequence having a code length n=3.

The memory 10 adopts a memory having 6 address input bits and an m-bit control signal Cm, and also having 3 output bits $B_1$, $B_2$, and $B_3$. The 3 output bits $B_1$, $B_2$, and $B_3$ are respectively input to 1-stage registers $11_1$, $11_2$, and $11_3$ each having a delay function corresponding to one clock. The output bits delayed by one clock by these registers serve as 3 address input bits of the 6 address input bits of the memory 10, and the digital input signals $A_1$, $A_2$, and $A_3$ are applied to the remaining 3 address input bits. The 3 output bits $B_1$, $B_2$, and $B_3$ of the memory 10 are output as a PN sequence having a code length n=3.

Figures 10, 11:
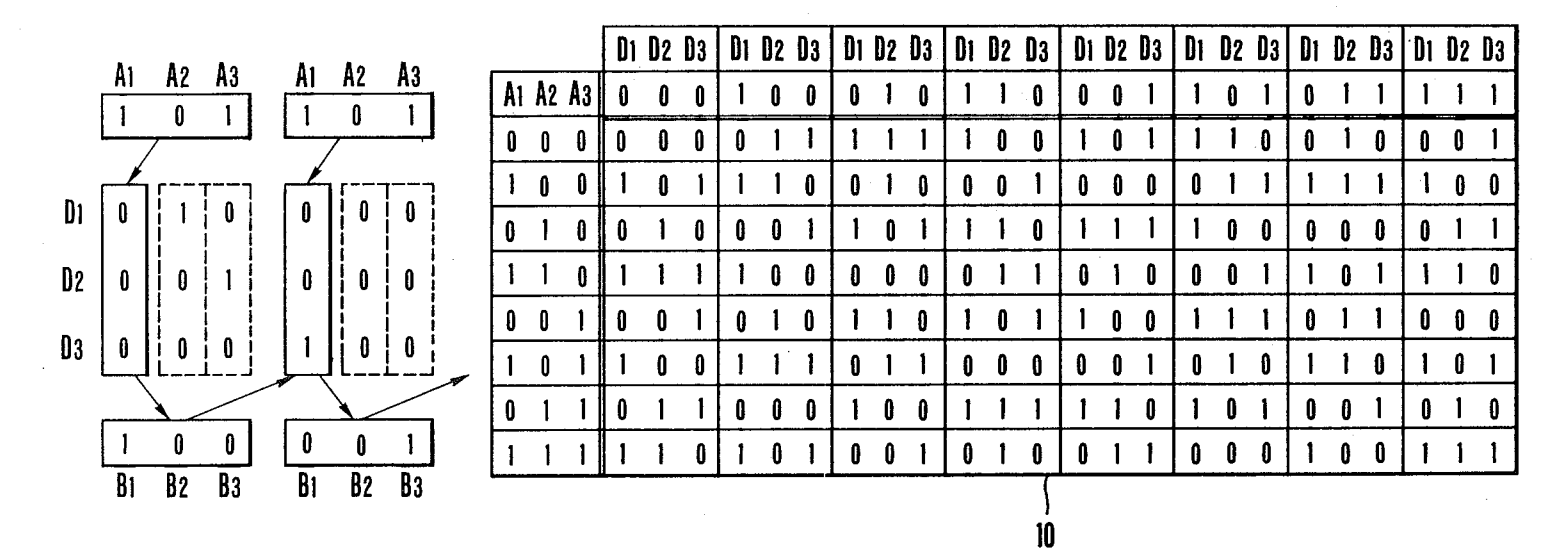

FIG. 10 is a state diagram of the circuit shown in FIG. 9. FIG. 11 shows data prestored at an address defined by $(A_1A_2A_3)$ and $D_1D_2D_3)$. For example, (000) is prestored at an address $(D_1D_2D_3A_1A_2A_3)$ of the memory 10.

In this embodiment, when the m-bit control signal is added to the address inputs, generation of identical continuous patterns with respect to inputting of continuous identical patterns can be prevented for the same reasons as in the embodiment shown in FIG. 8.

In the embodiments shown in FIG. 8 and 9, the case has been described wherein n=2 or 3 (N=2 or 3 as a code length). In general, in the case of n, a memory having 2n address input bits and n readout output bits is used. In addition, n registers for delaying n output bits by one block respectively are arranged. The output bits from the n registers are used as n address bits of the 2n address bits, and n digital input signals are used as the remaining address bits. As a matter of course, an m-bit control signal can be used in this case.

In this embodiment, generation of PN sequences has been described. However, the present invention can be similarly applied to generation of other codes, e.g., Gold sequences. Furthermore, the present invention can be applied not only to a code generator but also to a code decoder.

As described above, according to the present invention, since code patterns corresponding to sequences to be converted are prestored in a memory, no P/S and S/P converters nor timing signals for these converters are required.

If the number of digital input signals is increased, the memory need only be replaced, and the number of registers need only be increased/decreased accordingly. Thus, hardware for PN sequence processing can be easily changed.

Since no shift register is used, a total time required for processing a code length N is not necessary, and high-speed processing can be expected.

When a control signal is adopted, generation of (N+1) continuous identical codes due to an input signal pattern, as a feature of a PN sequence, can be prevented. Detection of identical pattern signals as a drawback when a PN sequence generator is employed as an encrypting circuit is disabled, and random signal patterns can be obtained.

What is claimed is:

1. A pseudo-noise sequence generator comprising:
   a memory accessed by a 2n-bit address signal to output a parallel n-bit pseudo-noise sequence, n out of 2n address signal input terminals of said memory receiving n parallel digital signal bits; and
   n registers for delaying each bit of n-bit data output from said memory by one clock and outputting the delayed n-bit data, the outputs from said n registers being supplied to remaining n address signal input terminals of said 2n address signal input terminals of said memory in one-to-one correspondence,
   wherein said memory prestores pseudo-noise sequence data corresponding to an address signal input from said 2n address signal input terminals.

2. A pseudo-noise sequence generator comprising:
   a memory accessed by a (2n+m)-bit address signal to output a parallel n-bit pseudo-noise sequence, a parallel n-bit digital signal being input of n of (2n+m) address signal input terminals of said memory, and a parallel m-bit control signal being input to the remaining n address signal input terminals; and
   n registers for delaying each bit of then-bit data output from said memory by one clock and outputting the delayed n-bit data, the outputs from said n registers being supplied to the remaining n address input terminals of said memory in one-to-one correspondence,
   wherein said memory prestores pseudo-noise sequence data corresponding to an address signal input from said (2n+m) address signal input terminals.

* * * * *

UNITED STATES PATENT AND TRADEMARK OFFICE
CERTIFICATE OF CORRECTION

PATENT NO. : 4,875,021
DATED : October 17, 1989
INVENTOR(S) : Noriyoshi Sonetaka It is certified that error appears in the above-identified patent and that said Letters Patent is hereby corrected as shown below:

Column 3, line 49, delete "$8D_1D_2A_1A_2)$", and insert --$(D_1D_2A_1A_2)$--.

Column 6, line 11, delete "of", and insert --to--.

Signed and Sealed this

Eighteenth Day of December, 1990

Attest:

HARRY F. MANBECK, JR.

Attesting Officer

Commissioner of Patents and Trademarks